(12) United States Patent
Metzler

(10) Patent No.: US 6,855,614 B2
(45) Date of Patent: Feb. 15, 2005

(54) SIDEWALLS AS SEMICONDUCTOR ETCH STOP AND DIFFUSION BARRIER

(75) Inventor: Richard A. Metzler, Mission Viejo, CA (US)

(73) Assignee: Integrated Discrete Devices, LLC, Costa Mesa, CA (US)

(*) Notice: Subject to any disclaimer, the term of this patent is extended or adjusted under 35 U.S.C. 154(b) by 220 days.

(21) Appl. No.: 09/982,855

(22) Filed: Oct. 22, 2001

(65) Prior Publication Data

US 2002/0066939 A1 Jun. 6, 2002

Related U.S. Application Data

(63) Continuation-in-part of application No. 09/712,449, filed on Nov. 13, 2000, now Pat. No. 6,580,150.

(51) Int. Cl.$^7$ .................. H01L 21/331; H01L 21/44
(52) U.S. Cl. ......................... 438/349; 438/100
(58) Field of Search ................. 438/328, 237, 438/965, 100, 379, 81, 912, 40–44, 349; 257/594, 287, 653

(56) References Cited

U.S. PATENT DOCUMENTS

| | | |
|---|---|---|
| 2,444,255 A | 6/1948 | Hewlett |
| 3,295,030 A | 12/1966 | Allison |
| 3,407,343 A | 10/1968 | Fang |
| 3,427,708 A | 2/1969 | Schütze et al. |
| 3,458,798 A | 7/1969 | Fang et al. |
| 3,566,215 A | 2/1971 | Heywang |
| 3,586,925 A | 6/1971 | Collard |
| 3,617,824 A | 11/1971 | Shinoda et al. |
| 3,619,737 A | 11/1971 | Chiu |
| 3,749,987 A | 7/1973 | Anantha |
| 3,769,109 A | 10/1973 | MacRae et al. |
| 3,864,819 A | 2/1975 | Ying |

(List continued on next page.)

FOREIGN PATENT DOCUMENTS

| | | |
|---|---|---|
| DE | 32 19 888 A1 | 1/1983 |
| DE | 196 05 633 A1 | 12/1996 |
| JP | 61-156882 | 7/1986 |
| JP | 63-054762 | 3/1988 |
| JP | 63-205927 | 8/1988 |
| JP | 5-109883 | 4/1993 |
| WO | WO 98/33218 | 7/1998 |

OTHER PUBLICATIONS

Wolf, Stanley et al., "Silicon Processing for the VLSI Era", 1986, pp. 321–327, Lattice Press, Sunset Beach, CA.

Maleis, Hanafy E., "Full–Wave Rectifier for CMOS IC Chip", United States Staturory Invention Registration No. H64, May 6, 1986.

Kim, Han–Soo et al., "Breakdown Voltage Enhancement of the p–n Junction by Self–Aligned Double Diffusion Process Through a Tapered SiO2 Implant Maske".

K. Jano, M. Mitsui, J. Morita, M. Kasuga & A. Shimizu; Applicaiton of a Junction Field Effect Transistor Structure to a Low Loss Diode; Jpn. j. Appl. Phys. vol. 36, pp. 1487–1493; 1997.

*Primary Examiner*—Craig A. Thompson
(74) *Attorney, Agent, or Firm*—Blakely, Sokoloff, Taylor & Zafman LLP

(57) ABSTRACT

Methods and apparatus of forming a semiconductor device using pedestals and sidewalls. The pedestals and sidewalls may provide an etch stop and/or a diffusion barrier during manufacture of a semiconductor device. Processes of forming diode connected vertical cylindrical field effect devices are disclosed to exemplify the use of the pedestals and/or sidewalls. A system for forming the pedestals and sidewalls is described.

52 Claims, 15 Drawing Sheets

U.S. PATENT DOCUMENTS

| | | |
|---|---|---|
| 3,935,586 A | 1/1976 | Landheer et al. |
| 3,943,547 A | 3/1976 | Nagano et al. |
| 3,988,765 A | 10/1976 | Pikor |
| 4,019,248 A | 4/1977 | Black |
| 4,045,250 A | 8/1977 | Dingwall |
| 4,099,260 A | 7/1978 | Lynes et al. |
| 4,104,086 A | 8/1978 | Bondur et al. |
| 4,138,280 A | 2/1979 | Rodov |
| 4,139,880 A | 2/1979 | Ulmer et al. |
| 4,139,935 A | 2/1979 | Bertin et al. |
| 4,140,560 A | 2/1979 | Rodov |
| 4,153,904 A | 5/1979 | Tasch, Jr. et al. |
| 4,246,502 A | 1/1981 | Kubinec |
| 4,318,751 A | 3/1982 | Horng |
| 4,330,384 A | 5/1982 | Okudaira et al. |
| 4,340,900 A | 7/1982 | Goronkin |
| 4,372,034 A | 2/1983 | Bohr |
| 4,403,396 A | 9/1983 | Stein |
| 4,423,456 A | 12/1983 | Zaidenweber |
| 4,508,579 A | 4/1985 | Goth et al. |
| 4,533,988 A | 8/1985 | Daly et al. |
| 4,534,826 A | 8/1985 | Goth et al. |
| 4,579,626 A | 4/1986 | Wallace |
| 4,586,075 A | 4/1986 | Schwenk et al. |
| 4,638,551 A | 1/1987 | Einthoven |
| 4,666,556 A | 5/1987 | Fulton et al. |
| 4,672,736 A | 6/1987 | Westermeier |
| 4,672,738 A | 6/1987 | Stengl et al. |
| 4,680,601 A | 7/1987 | Mitlehner et al. |
| 4,703,554 A * | 11/1987 | Havemann ................ 438/348 |
| 4,739,386 A | 4/1988 | Tanizawa |
| 4,742,377 A | 5/1988 | Einthoven |
| 4,745,395 A | 5/1988 | Robinson |
| 4,757,031 A | 7/1988 | Kuhnert et al. |
| 4,774,560 A | 9/1988 | Coe |
| 4,777,580 A | 10/1988 | Bingham |
| 4,808,542 A | 2/1989 | Reichert et al. |
| 4,811,065 A | 3/1989 | Cogan |
| 4,822,757 A | 4/1989 | Sadamori |
| 4,857,985 A | 8/1989 | Miller |
| 4,875,151 A | 10/1989 | Ellsworth et al. |
| 4,900,692 A | 2/1990 | Robinson |
| 4,903,189 A | 2/1990 | Ngo et al. |
| 4,927,772 A | 5/1990 | Arthur et al. |
| 4,974,050 A | 11/1990 | Fuchs |
| 5,038,266 A | 8/1991 | Callen et al. |
| 5,047,355 A | 9/1991 | Huber et al. |
| 5,068,202 A * | 11/1991 | Crotti et al. ................ 438/433 |
| 5,081,509 A | 1/1992 | Kozaka et al. |
| 5,093,693 A | 3/1992 | Abbas et al. |
| 5,101,254 A | 3/1992 | Hamana |
| 5,109,256 A | 4/1992 | De Long |
| 5,132,749 A | 7/1992 | Nishibayashi et al. |
| 5,144,547 A | 9/1992 | Masamoto |
| 5,184,198 A | 2/1993 | Bartur |
| 5,225,376 A | 7/1993 | Feaver et al. |
| 5,258,640 A | 11/1993 | Hsieh et al. |
| 5,268,833 A | 12/1993 | Axer |
| 5,296,406 A | 3/1994 | Readdie et al. |
| 5,340,757 A | 8/1994 | Chantre et al. |
| 5,349,230 A | 9/1994 | Shigekane |
| 5,357,131 A | 10/1994 | Sunami et al. |
| 5,365,102 A | 11/1994 | Mehrotra et al. |
| 5,396,087 A | 3/1995 | Baliga |
| 5,426,325 A | 6/1995 | Chang et al. |
| 5,430,323 A | 7/1995 | Yamazaki et al. |
| 5,469,103 A | 11/1995 | Shigekane |
| 5,475,245 A | 12/1995 | Kudo et al. |
| 5,475,252 A | 12/1995 | Merrill et al. |
| 5,479,626 A | 12/1995 | Bindloss et al. |
| 5,506,421 A | 4/1996 | Palmour |
| 5,510,641 A | 4/1996 | Yee et al. |
| 5,536,676 A | 7/1996 | Cheng et al. |
| 5,780,324 A | 7/1998 | Tokura et al. |
| 5,818,084 A | 10/1998 | Williams et al. |
| 5,825,079 A | 10/1998 | Metzler et al. |
| 5,886,383 A | 3/1999 | Kinzer |
| 5,907,181 A | 5/1999 | Han et al. |
| 6,002,574 A | 12/1999 | Metzler et al. |
| 6,186,408 B1 | 2/2001 | Rodov et al. |
| 6,225,176 B1 * | 5/2001 | Yu ............................ 438/305 |

\* cited by examiner

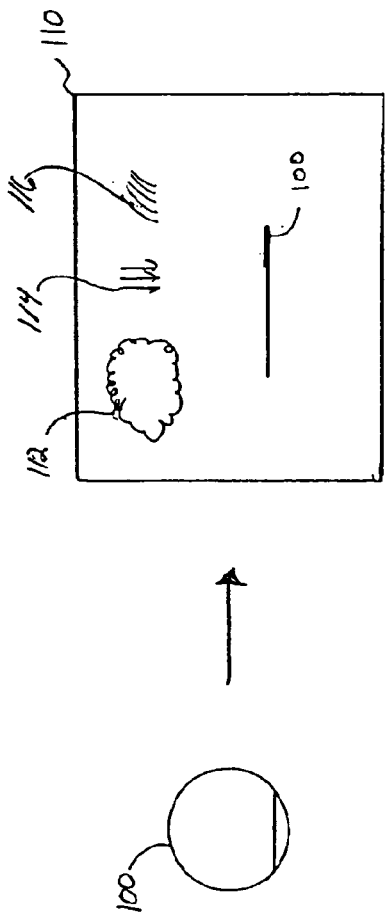
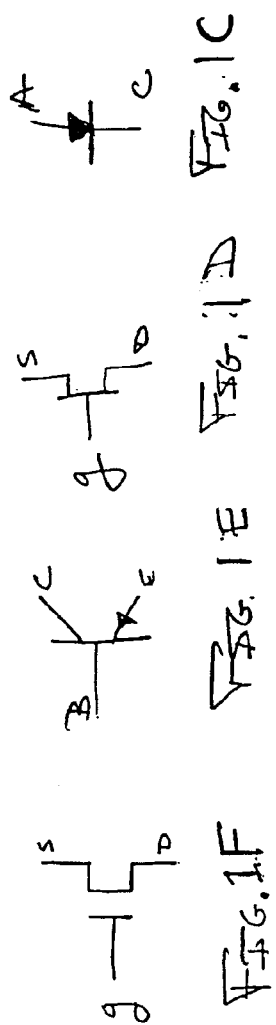

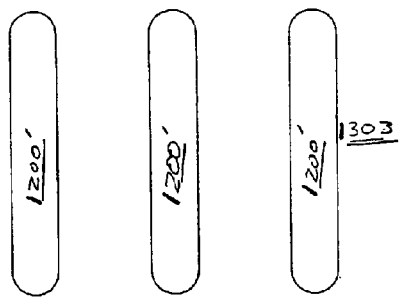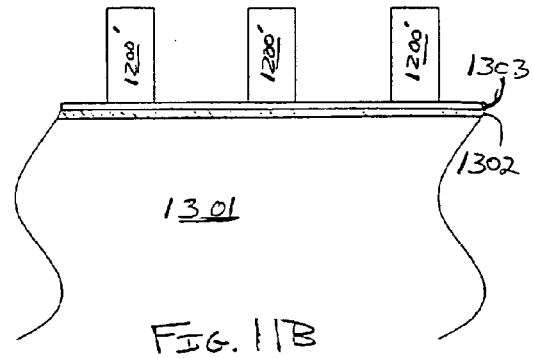
FIG. 11A   FIG. 11B
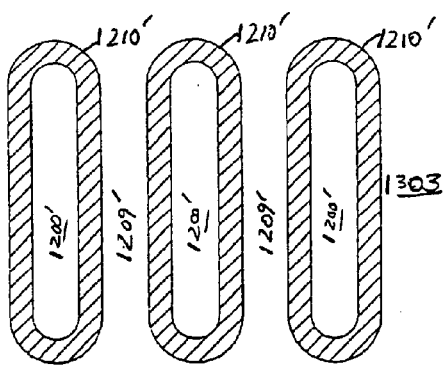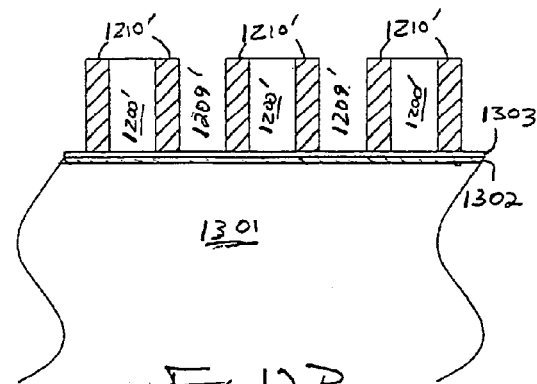
FIG. 12A   FIG. 12B
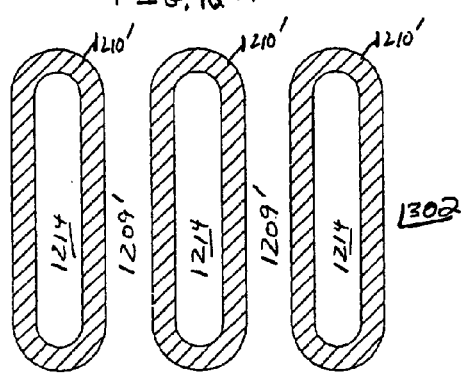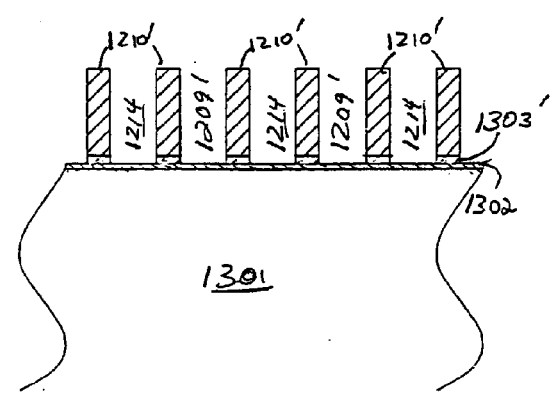
FIG. 13A   FIG. 13B

SIDEWALLS AS SEMICONDUCTOR ETCH STOP AND DIFFUSION BARRIER

CROSS REFERENCE TO RELATED APPLICATIONS

This application is a continuation-in-part of U.S. patent application Ser. No. 09/712,449 entitled "VERTICAL JUNCTION FIELD EFFECT SEMICONDUCTOR DIODES" filed by Richard A. Metzler on Nov. 13, 2000, now issued as U.S. Pat. No. 6,580,150 B1.

Furthermore, this application is related to U.S. patent application Ser. No. 09/689,074 entitled "METHOD AND APPARATUS FOR PATTERNING FINE DIMENSIONS" filed by Richard A. Metzler on Oct. 12, 2000, now issued as U.S. Pat. No. 6,667,237 B1, and U.S. patent application Ser. No. 09/502,026 entitled "METHOD AND APPARATUS FOR CYLINDRICAL SEMICONDUCTOR DIODES" filed by Richard A. Metzler on Feb. 10, 2000, now issued as U.S. Pat. No. 6,433,370 B1.

BACKGROUND OF THE INVENTION

1. Field of the Invention

The invention generally relates to semiconductor devices and fabrication of the same.

2. Background Information

It is desirable to form smaller geometries or dimensions for semiconductor devices for a number or reasons including to decrease manufacturing costs. A smaller semiconductor device uses less area on a wafer so that additional devices can be formed in the same area of a wafer. More dense features allows for more dense devices, such as increased channel width in MOSFETs which leads to lower on resistance. Additionally, by providing finer geometry devices, die size can be reduced in order to reduce manufacturing costs of devices.

Semiconductor devices of various kinds are well known in the prior art. One semiconductor device that is well known is a semiconductor diode. Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In manufacturing semiconductor devices, the fabrication process typically includes etching and diffusion. Etching is a process where material is removed from a substrate, a layer or thin film that was placed on a substrate. Diffusion is a process where a dopant is introduced into a material and diffuses therein as a gradient of the dopant. In either case, a pattern is typically used to selectively etch or diffuse a dopant in areas of a semiconductor wafer for manufacturing semiconductor devices.

Etching can be accomplished by a wet etch process or a dry etch process. A wet etch process typically involves removing exposed material in a wet acid bath. A dry etch process avoids the use of a wet acid bath and typically uses a chemical introduced by a gas under pressure or into a chamber with lower than atmospheric pressure with ions excited by an excitation energy. An etch process which etches a material in all directions at the same rate is said to be isotropic. An etch process which has a horizontal etch rate that differs from a vertical etch rate for a material is not isotropic but is said to be anisotropic. A lateral etch ratio Lr is defined as the ratio of the etch rate in the horizontal direction to the etch rate in the vertical direction for a give material. Lr=(Horizontal Etch Rate of Material/Vertical Etch Rate of Material). The degree of anisotropy A=(1−Lr).

Diffusion can be accomplished by supplying a dopant to the semiconductor material and heating the dopant and the semiconductor material together to diffuse the dopant into the silicon. Supplying the dopant to the semiconductor material can be accomplished by implanting the dopant by ion implantation methods. To complete the diffusion step, the semiconductor material is heated with the implanted dopant to diffuse the dopant into the semiconductor material.

In order to form a pattern of diffusion or to etch a pattern of material, a mask or photoresist material is typically used to protect material that is not to be etched or is not to have a dopant diffused therein and expose material that is to be etched or is to have a dopant diffused therein. Other known methods can be used to protect material as well as expose material to form a pattern for etching and diffusing.

BRIEF SUMMARY OF THE INVENTION

The invention includes methods and apparatus as described in the claims found below.

BRIEF DESCRIPTION OF THE FIGURES

FIG. 1B illustrates the semiconductor wafer inserted into a chamber, oven, or other container for etching or diffusion processing to manufacture a semiconductor device.

FIG. 1C is a schematic diagram of a semiconductor device which may be manufactured on the semiconductor wafer.

FIG. 1D is a schematic diagram of a semiconductor device which may be manufactured on the semiconductor wafer.

FIG. 1E is a schematic diagram of a semiconductor device which may be manufactured on the semiconductor wafer.

FIG. 1F is a schematic diagram of a semiconductor device which may be manufactured on the semiconductor wafer.

FIGS. 11A–11B, 12A–12B, and 13A–13B are top views and cross-section side views illustrating yet another embodiment for forming fine geometric dimensions of a repetitive pattern using sidewalls.

Like reference numbers and designations in the drawings indicate like elements providing similar functionality.

DETAILED DESCRIPTION OF THE INVENTION

Methods and apparatus of forming a semiconductor device using pedestals and sidewalls are disclosed. The pedestals and sidewalls may provide an etch stop and/or a diffusion barrier during manufacture of a semiconductor device. Processes of forming diode connected vertical cylindrical field effect devices are disclosed to exemplify the use of the pedestals and/or sidewalls. Systems for forming the pedestals and sidewalls onto a wafer are disclosed.

Figure 1A:
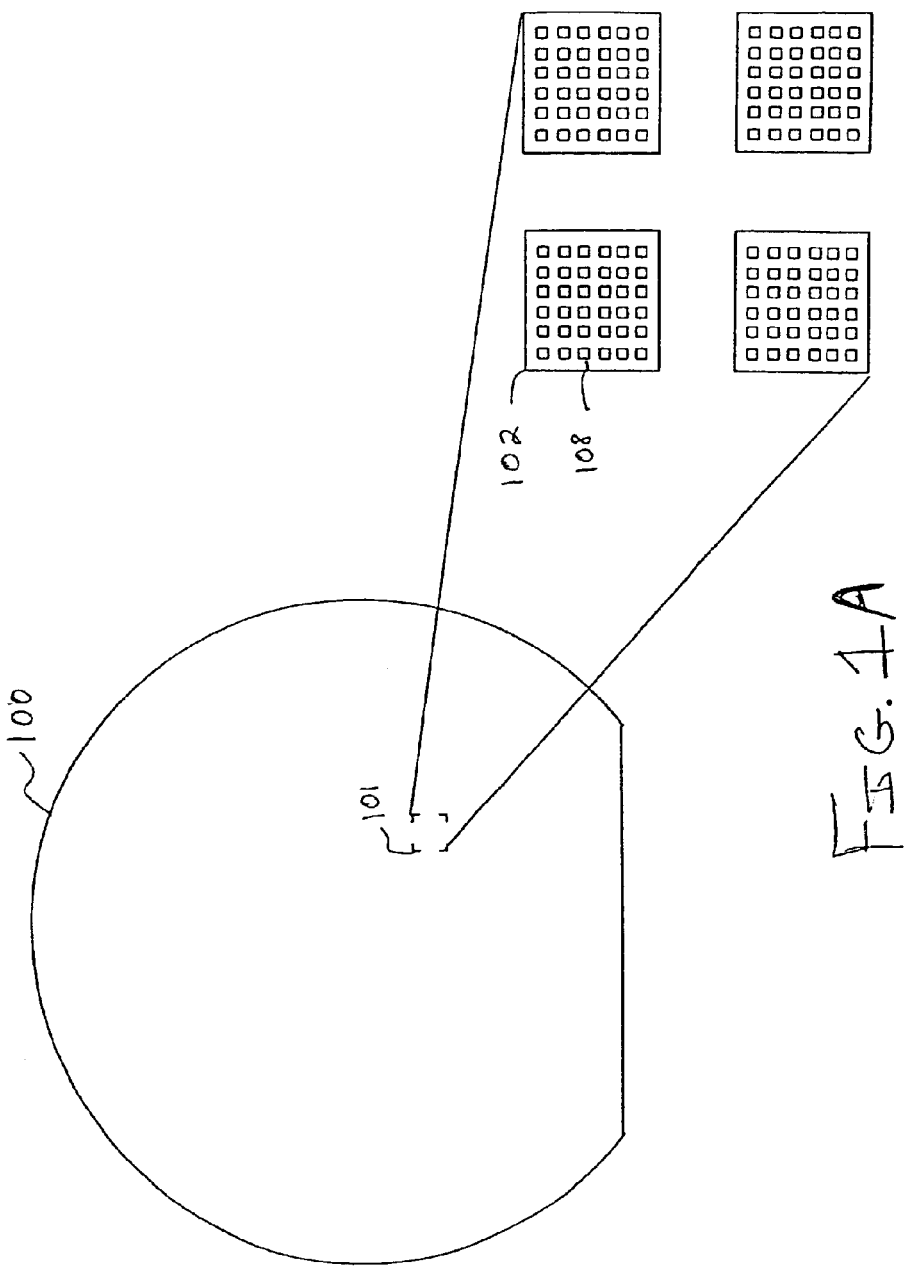
FIG. 1A illustrates a semiconductor wafer with a repetitive pattern.

Referring now to FIG. 1A, a semiconductor wafer 100 having a repetitive geometric pattern is illustrated. An exploded view of a portion 101 of the wafer 100 is illustrated as well. The wafer 100 includes a plurality of device areas 102. Each of the device areas 102 includes a repetitive geometric pattern 108 which is patterned in accordance with the invention using semiconductor manufacturing processes and techniques. Scribe channels are defined between device areas 102 in order to separate them after completion of processing the wafer 100. It is understood that there are many device areas 102 on the wafer 100, with only four being shown in FIG. 1A. Each individual device area 102 may contain thousands or more or less of the repetitive geometric pattern 108.

Referring now to FIG. 1B, the semiconductor wafer 100 during manufacturing may be placed into a chamber, oven, or other container 110 for diffusion or etch processing. The diffusion or etch processing may occur over a pattern. The diffusion or etch processing may be accomplished in the chamber, oven, or other container 110 by using a gas 112, ion implantation 114, a wet chemical 116, a plasma, or other method of delivering a chemical or ion or a combination thereof.

Referring now to FIGS. 1C–1F, the invention can be utilized in manufacturing a number of types of devices including semiconductor devices illustrated herein. FIG. 1C illustrates a schematic symbol for a diode having an anode (a) and a cathode (c). FIG. 1D illustrates a schematic symbol for a junction field effect transistor (JFET) having a gate (g), source (s), and drain (d). FIG. 1E illustrates a schematic symbol for a bipolar-junction transistor (BJT) having a base (b), a collector (c), and an emitter (e). FIG. 1F illustrates a schematic symbol for an insulated gate field effect transistor (IGFET) having a gate (g), a source (s), and a drain (d). The invention can be utilized to manufacture these and other devices during etching and diffusion of dopants. The invention is particularly well suited to the manufacture of power metal oxide semiconductor field effect transistors (MOSFETs) when used in a repetitive pattern.

Referring now to FIGS. 2A through 2I, the steps to forming fine geometries using larger mask dimensions is illustrated. In the embodiment depicted in FIGS. 2A–2F, material1 and material2 are etched independently. In the case of semiconductor processing for example, material1 and material2 can be polysilicon and oxide or oxide and polysilicon respectively in alternate embodiments. In the first steps of the invention, a repetitive pattern of "pedestals" of material1 are formed on the surface of a substrate or a support material. The pedestals as will be further illustrated can be of any shape including circles, squares, rectangles, bars, etc. The repetitive pattern of pedestals has a cross-section dimension or width and a spacing there between to form a pitch of the repetitive pattern. Either of the width and spacing dimensions can be modified to alter the dimensions of the fine geometries of the end result.

Figure 2A:
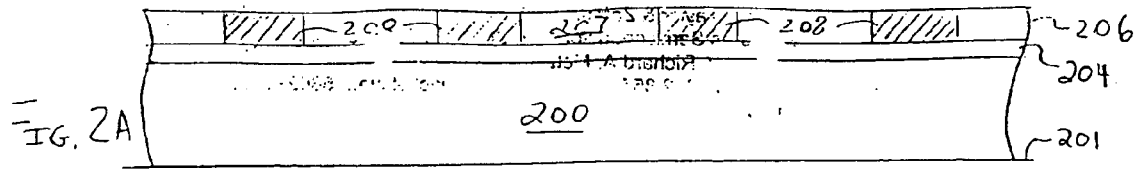
FIGS. 2A–2F are cross-sectional views illustrating the steps in one embodiment for forming fine geometric dimensions of a repetitive pattern.

In FIG. 2A, material1 200 is deposited or grown onto a support member 201. The support member 201 may be a substrate or a backing which facilities supporting the fine geometries. If the support member 201 is a substrate, it is etched independently of material1 and material2. A photoresist 204 is deposited on top of the material1 layer 200. A mask 206 having a desired pattern is used to generate a first geometric shape. The dimensions of the repetitive pattern of the desired geometric shape is larger than the desired end result. The end resultant fine geometries of the repetitive pattern has a smaller pitch than ordinarily obtained from the pitch of the mask dimensions.

Figure 2B:
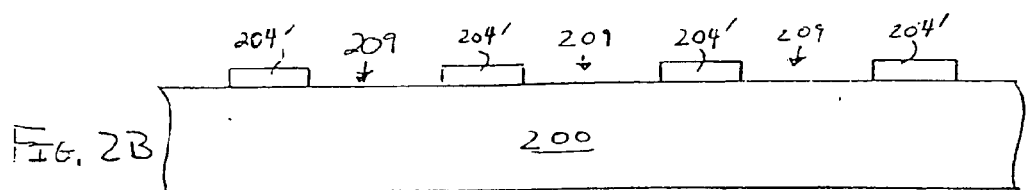

The mask 206 has a pattern 208 therein which blocks light or other electromagnetic radiation from propagating through areas of the mask 206. Openings 207 in the pattern of the mask 206 exposes the photoresist material 204 to the electromagnetic radiation. After the photoresist 204 is exposed to the electromagnetic radiation, those areas can be then etched away leaving the pattern photoresist 204' on the material1 layer 200 as illustrated in FIG. 2B. The pattern of photoresist 204' has openings 209 exposing the material1 layer 200.

Figure 2C:
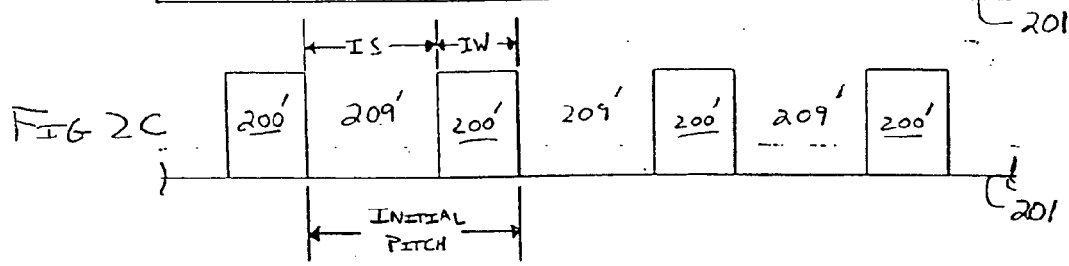

The material1 layer 200 which is exposed at openings 209 can be etched away to the support material 201. Preferably the exposed portions of the material1 layer 200 are etched away by plasma etching so that pedestals 200' will have substantially straight (vertical) sidewalls, as opposed to somewhat tapered sidewalls typically provided by wet etching. After etching, the pattern of photoresist 204' is then removed from the surfaces to generate the patterned pedestals 200' formed from the material1 layer 200 as illustrated in FIG. 2C.

The repetitive pattern of the pedestals 200' formed out of the layer of material1 establishes the initial pitch (IP). The initial pitch is formed of an initial space (IS) 209' between the pedestals 200' and an initial width (IW) of the pedestals 200'. The initial pitch is the sum of dimension of the initial space IS and the initial width IW. IP=IS+IW. In one embodiment, the initial width is 0.3 microns (um) and the initial space is 0.5 um forming an initial pitch of 0.8 um. In another embodiment, the initial width is 0.75 um and the initial space is 1.25 um forming an initial pitch of 2 um. By varying these initial dimensions in the pedestals, other resultant dimensions in fine geometries can be obtained. The repetitive pattern of pedestals 200' becomes a construction element for the next step of the process.

Figure 2D:
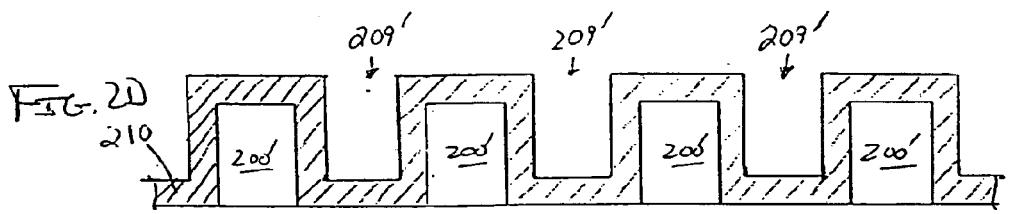
Figure 2E:
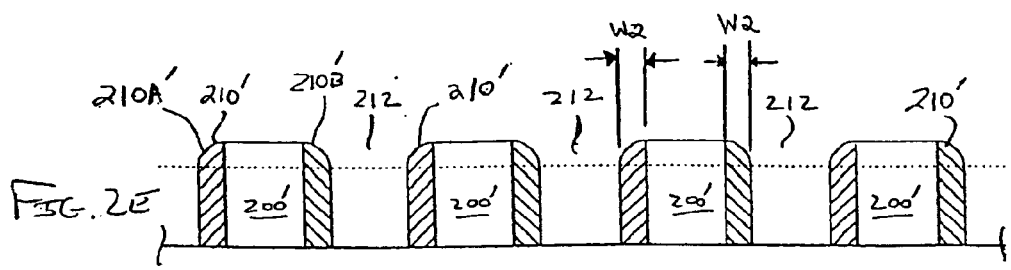

After the pattern of pedestals 200' is formed, a layer of material2 210 is uniformly deposited onto the exposed horizontal and vertical surfaces of the first geometric pattern 200' as illustrated in FIG. 2D. Such a deposition can be done by Chemical Vapor Deposition (CVD) techniques commonly used in semiconductor processing. The layer of material2 210 surrounds the pattern 200' and is also deposited there between in the spaces 209'.

After depositing the material2 layer 210, a selective etch can be used to etch away its horizontal portions to the top of the pattern 200' and in the spaces 209' down to the supporting material 201. The selective etch only etches vertically the exposed horizontal portions of the material2 layer 210. A Reactive Ion Etch (RIE) utilized in semiconductor manufacturing processes is used to perform the selective etching or vertical etching of horizontal surfaces. This results in leaving patterned sidewalls 210' of material2 intact surrounding the patterned pedestals 200' of material1 as illustrated by the cross sections 210A' and 210B' in FIG. 2E. Each of the cross sections 210A' and 210B' have a width (W2) and a space 212 between them.

Figure 2F:
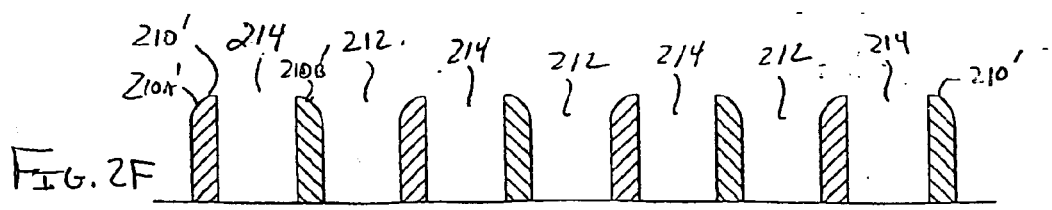

Referring now to FIG. 2F, after forming the sidewalls 210', another etch is used to etch away the patterned pedestals 200' of material1. This results in the sidewalls 210' having spaces 214 between their cross sections 210A' and 210B' as well as spaces 212. This etching step may be a "wet" etch as is used in the semiconductor manufacturing processes. If the material1 of the patterned pedestals 200' is a silicon oxide, the etching step can be a Buffered Oxide Etch (BOE), essentially a bath of diluted hydrofluoric acid and ammonium fluoride. Appropriately selected dry etches may also be used. If the pattern sidewalls 210' have the desired width W2 and spacing 212 and 214 there-between, no further division of the initial pitch is required at this point. In one embodiment the width W2 is 0.25 um while in another embodiment the width W2 is 0.1 um. With the desired feature size of the patterned sidewalls 210' achieved, the substrate or support surface 201 can be processed.

The fine pattern of patterned sidewalls 210' can be utilized as an etch stop or mask for other etching steps of the substrate or support surface 201 or other material layers during semiconductor processing. In this case, sidewalls protect the material layers under the sidewalls from being etched during the etching of the material around the plurality of sidewalls. Alternatively, the fine pattern of patterned sidewalls 210' can be utilized as a diffusion barrier to further diffusion steps of the substrate or support surface 201 or other material layers during semiconductor processing. In this case, the sidewalls protect the material under the sidewalls from receiving the dopant when further diffusion steps of a dopant occurs around the sidewalls. Furthermore, the fine pattern of patterned sidewalls 210' can be utilized as both an etch stop and a diffusion barrier in further processing steps. That is, the pattern of sidewalls 210' can act as a mask layer including an etch mask for further etch processing or a diffusion mask for further diffusion of dopants into other materials. Alternatively, the pattern of sidewalls 210' are a starting pillar for structure to be formed using semiconductor processing steps.

The invention will now be illustrated using a semiconductor diode device formed out of a semiconductor transistor device with a diode connection. A semiconductor diode is formed out of a vertical and cylindrical shaped junction field effect transistor (JFET) having a diode connected configuration. A vertical and cylindrical shaped junction field effect transistor (JFET) having a diode connected configuration is referred to herein as a diode configured vertical junction field effect device. (JFED). The diode configured vertical JFED provides a higher channel density and can be formed using a simpler manufacturing process. The higher channel density allows a semiconductor diode to be formed in an area of silicon approximately one third of that of prior semiconductor diodes having similar performance. The higher channel density provides a considerable cost and performance advantage.

A process for fabricating embodiments of the diode configured vertical junction field effect device (JFED) are presented herein in relation to the cross-sectional views of FIGS. 3A–3F and FIGS. 4A–4I. The process forms the diode configured vertical junction field effect device (JFED). The diode configured vertical junction field effect device (JFED) can be essentially thought of as a cylindrical and vertical junction field effect transistor being diode connected with common gate and drain connections. The diode configured vertical junction field effect device may also be referred to as a vertical JFED diode. However, a diode configured vertical junction field effect device (JFED) is not a traditional junction field effect transistor (JFET) because it operates differently and is formed by a different process.

Referring now to FIGS. 3A–3F, cross-sectional views of steps to an exemplary process for fabricating a diode connected vertical junction field effect device are illustrated. The diode connected or diode configured vertical JFED is formed using cylindrical pedestals. FIGS. 3A–3F show only a portion of a wafer. It being understood that similar processing is performed across larger portions or an entire semiconductor wafer forming more diode configured vertical JFEDs than illustrated.

Figure 3A:
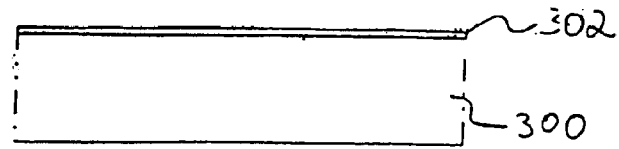
FIGS. 3A–3F are cross-sectional views illustrating steps in an exemplary process for fabricating a diode connected vertical junction field effect device.

FIG. 3A shows a starting substrate 300 of a wafer. The substrate 300 can be silicon, gallium-arsenide (GaAs), germanium, silicon-carbide (SiC), or other known semiconductor substrate. In one embodiment, the substrate 300 is a silicon substrate having a silicon epitaxial layer therein. The silicon epitaxial layer is provided in order to form an increased reverse bias breakdown voltage for diode devices. In one embodiment, the silicon epitaxial layer has a resistivity of approximately 1.1 ohm-cm and a thickness of approximately 3 um in order to achieve a reverse bias breakdown voltage of about forty-five volts. Epitaxial wafers having the silicon epitaxial layer can be purchased as starting material, or formed as part of the processing of the diode using well known standard epitaxial growth techniques.

In the case of an N-type silicon substrate, the lower or backside surface of the substrate 300 forms the cathode while a portion of the top surface of the substrate 300 is formed to be the anode. In the case of a P-type silicon substrate, the diode terminals are reversed and the lower or backside surface of the substrate 300 forms the anode while a portion of the top surface of the substrate 300 is formed to be the anode.

A thin oxide 302 is grown on the surface of the substrate 300 in order to randomize sheet implants which are to follow. The thin oxide 302 is typically one hundred fifty Angstroms (150Å) in thickness. Both of the sheet implants that follow require no masking by a mask but rather are ions that are implanted over the entire wafer.

The first sheet implant is to provide a good ohmic contact for the Anode region of the vertical JFED diode. The first sheet implant is an Arsenic implant at about $3 \times 10^{15}$ atoms per $cm^2$ with an energy of 25 KeV. The second sheet implant is a Phosphorous implant at about $2.0 \times 10^{13}$ atoms per $cm^2$ implanted with an energy of 85 KeV. The second sheet implant sets the "threshold" or pinch off voltage of the vertical JFED diode similar to that of a JFET.

Figure 3B:
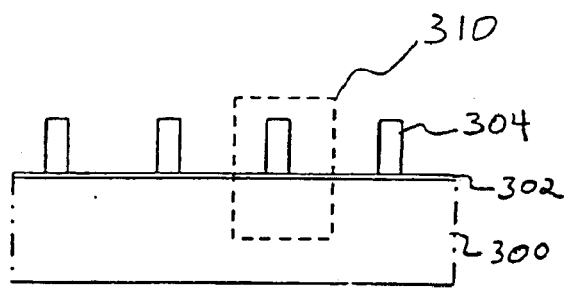

Referring now to FIG. 3B, completion of a first masking step is illustrated. Prior to the first masking step and etching, a layer of polysilicon is applied on top of the thin oxide 302 across the wafer. The polysilicon layer is then patterned using a mask and areas are etched away to form cylindrical shaped construction pedestals 304 on top of the thin oxide 302. The cylindrical shaped construction pedestals 304 are approximately 0.1 microns (um) high in one embodiment. The shape of the pedestals 304 can be any cylindrical shape, including but not limited to, circular, hexagonal, square, rectangular, as well as other sold shapes such as serpentine, etc. For ease of description herein, the cylindrical shape will be presumptively rectangular forming rectangular cylindrical pedestals or bars formed out of the polysilicon layer.

FIG. 3B illustrates a cross-section of four of a plurality of rectangular cylindrical pedestals 304 that are formed across the silicon wafer. The dimensions of the rectangular cylindrical construction pedestals 304 in one embodiment are approximately 0.15 microns in width, approximately 0.1 microns in height, with a pitch of approximately 0.4 microns. It is understood that these dimensions can be altered in coordination with any adjustment in the implantation levels in order to provide similar device physics for a diode configured vertical JFED. Region 310 of silicon wafer is exploded into FIG. 3C in order to further detail the processing around each of the plurality of pedestals 304.

The pattern of pedestals 304 can be utilized as an etch stop for other etching steps of the oxide layer 302, the substrate 300, other material layers, or a combination thereof during semiconductor processing. Alternatively, the pattern of pedestals 304 can be utilized as a diffusion barrier to further diffusion steps of the substrate 300, other material layers, or a combination thereof during semiconductor processing.

Figure 3C:
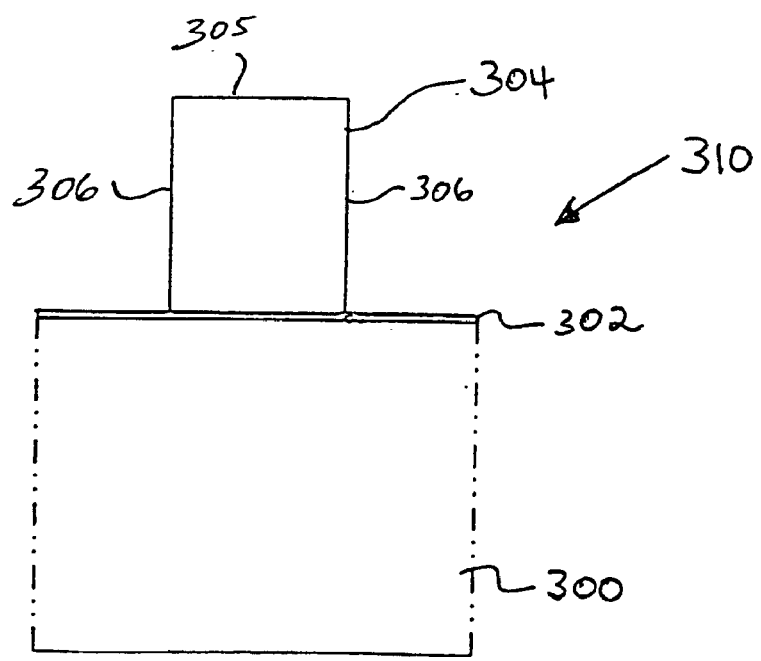
Figure 3D:
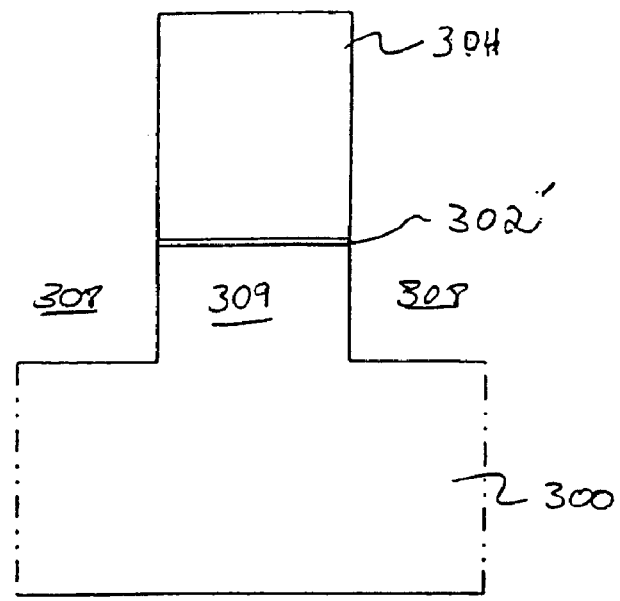
Figure 3E:
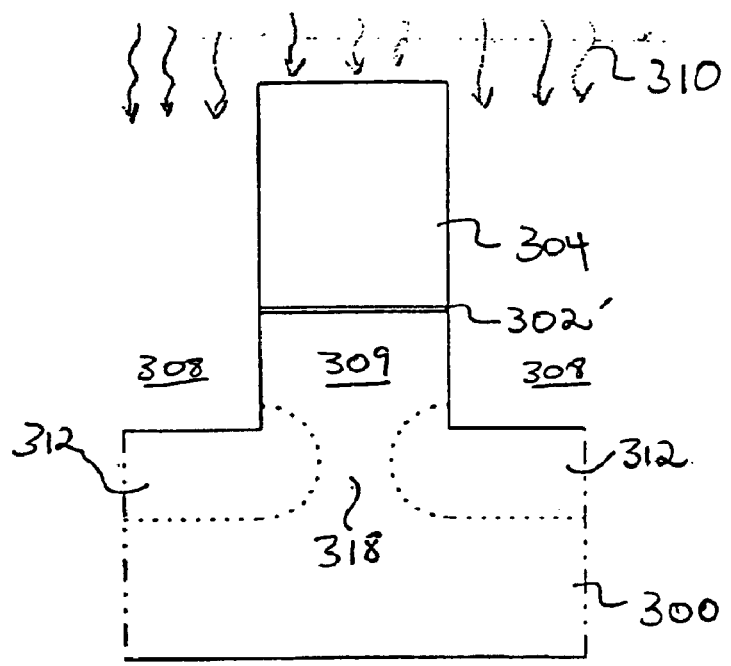
Figure 3F:
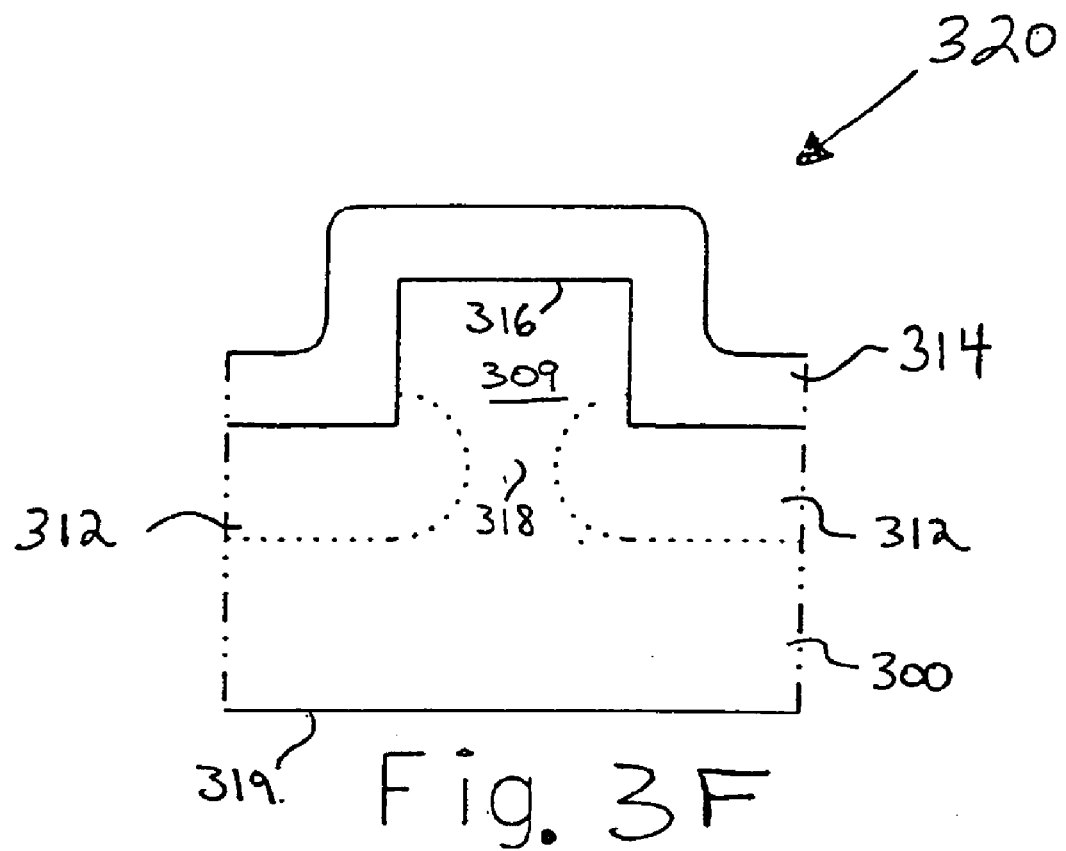

Referring now to FIG. 3C, an exploded view of region 310 of FIG. 3B is illustrated. The rectangular cylindrical construction pedestal 304 is formed on the surface of the thin oxide 302 on the substrate 300. FIGS. 3D–3F illustrate the further processing of the diode configured vertical JFED with respect to the rectangular cylindrical construction pedestal 304 of FIG. 3C. It is understood that similar processing occurs around each of the plurality of cylindrical construction pedestals 304.

Referring now to FIG. 3D, the thin oxide 302 around the pedestal 304 and a portion of the pedestal 304 and the substrate 300 have been etched away forming silicon trenches 308 and substrate pedestals 309. In this case, the pattern of pedestals 304 was utilized as an etch stop for etching both the oxide layer 302 and the substrate 300. The silicon trenches 308 are around the cylindrical construction pedestals 304, the substrate pedestals 309, and oxide disks 302'. The oxide disks 302' are cylindrical disk shaped portions of oxide material of the thin oxide 302 which is sandwiched between the cylindrical construction pedestals 304 and the substrate pedestals 309. The substrate pedestals 309 are cylindrically shaped similar to the construction pedestals 304 but are formed out of the substrate material 300 as opposed to polysilicon material. The cylindrical substrate pedestals 309 have a cylindrical top and a cylindrical side or sides depending upon their cylindrical shape. This etch step is a Reactive Ion Etch (RIE) commonly used in silicon processing to form trench metal-oxide-semiconductor (MOS) transistors and capacitors. The depth of the etch into the substrate 300, which is not critical, is approximately 0.1 microns in one embodiment. The depth of the etch into the substrate 300 forming the depth of the silicon trenches 308, preferably corresponds to the depth of the selected energy of the Phosphorous sheet implant step previously described. The depth of the etch provides adequate threshold or pinch off control of the diode configured vertical JFED.

Referring now to FIG. 3E to illustrate the next step in the process, a boron implantation 310 is performed at the base of the substrate pedestals 309 which penetrates into the silicon substrate 300. In this case, the pattern of pedestals 304 is utilized as a diffusion barrier to keep the oxide disks 302' and the substrate pedestals 309 from receiving dopant ions during diffusion. The boron implant diffuses laterally under the substrate pedestals 309, due to scattering and rapid thermal processing (RTP) for activation, and forms a diffusion ring around a center line of the pedestals 304 and 309 referred to as a gate 312. The diffusion ring of the gate 312 has a hollow cylindrical shape which encloses a vertical channel portion 318 of the substrate 300. The vertical channel portion of the substrate 300 is cylindrically shaped around the center line of the pedestals 309 and may also be referred to as a cylindrical substrate channel. This boron implant 310 (i) provides adequate surface concentration to assure an ohmic contact to metalization; (ii) provides a P-Type surface concentration to support a breakdown voltage depletion region; and (iii) laterally diffuses to provide a JFET equivalent gate to pinch off the current flow in the vertical channel between the Anode (Top silicon surface of the pedestal formed in FIG. 3.) and the Cathode (Silicon wafer backside) during operation of each diode configured vertical JFED.

Referring now to FIG. 3F, the final steps in the process of forming the diode configured vertical JFED 320 are illustrated where the remaining portions of the pedestals 304 and the disk shaped portions of the thin oxide 302 are removed and a metalization layer 314 added. An oxide etch is used to remove the oxide forming the oxide disks 302' and undercut the pedestals 304 in order to float or lift off any of their residual polysilicon material prior to metalization. A conductive layer 314, preferably a metal, is then deposited across the wafer making contact to the exposed top surfaces of the substrate 300. The conductor 314 makes contact to the diffusion ring of the P-type gate 312 and a cylindrical top surface 316 and a cylindrical side surface or surfaces of the substrate pedestals 309. The cylindrical top surface 316 and cylindrical side surfaces of the substrate pedestals 309, but for the P-type diffusion ring of the gate, function similar to a drain or source region of a JFET. The bottom surface of the substrate 300 functions similar to a source or drain region respectively of a JFET. Note that the definition of source and drain swaps based on voltage biasing across the diode terminals. The conductor 314 contacting the diffusion ring of the gate 312 and the top surface 316 and the side surfaces of the substrate pedestals 309 provides a connection therebetween to provide the diode configuration of the diode configured vertical JFED. In the case of the substrate 300 being an N-type of silicon and the gate 312 being P-type diffusion, the top surface 316 contact forms the anode of the diode. Alternatively if the substrate 300 is P-type silicon and the gate 312 being N-type diffusion, the top surface contact 316 forms the cathode. In the diode configured vertical JFED, there is little current flow from the side surfaces of the substrate pedestals 309 so that this contact area is largely non-functional. A majority of the current flow is through the top surface 316 of the substrate pedestals 309 when forward biased. From the top surface 316, the current flows through the center vertical cylindrical channel 318 of each diode configured vertical JFED 320 in a bottom portion and towards a bottom surface 319 of the substrate 300. A metal layer may optionally be applied to the bottom surface 319 of the substrate 300 or the bottom surface 319 may otherwise make contact to a conductive surface for forming a connection of the diode through which current may flow. The diode configured vertical JFEDs 320 can also be formed in a tub of silicon (equivalent to substrate 300) within an integrated circuit substrate and a top side surface contact can be made to the tub so that the current in the bottom portion of the tub is drawn from the bottom of the channel to the top side surface contacts. Forming the vertical JFEDs in this manner allows integration with other circuitry into an integrated circuit device.

While the pattern of pedestals 304 has been described as first being utilized as an etch stop and then utilized as a diffusion barrier, the order may be reversed in other semiconductor processes such that the pedestals 304 are first utilized as a diffusion barrier and then utilized as an etch stop.

Referring now to FIGS. 4A–4I, cross-sectional views of steps to another exemplary process for fabricating the diode connected vertical junction field effect device of are illustrated. The steps of forming the diode configured vertical JFED 320 illustrated in FIGS. 4A–4I is similar to that of the steps illustrated in FIGS. 3A–3F but that pedestals (previously referred to as sidewalls) are formed by using the steps described and illustrated with respect to FIGS. 2A–2F.

Figure 4A:
FIGS. 4A–4I are cross-sectional views illustrating steps in another exemplary process for fabricating the diode connected vertical junction field effect device.

FIGS. 4A–4I show only a portion of a wafer. It being understood that similar processing may be performed across larger portions or an entire semiconductor wafer forming more diode configured vertical JFEDs than illustrated. FIG. 4A shows a starting substrate 300 of a wafer. The substrate 300 can be silicon, gallium-arsenide (GaAs), germanium, silicon-carbide (SiC), or other known semiconductor substrate. In one embodiment, the substrate 300 is a silicon substrate having a silicon epitaxial layer therein. The silicon epitaxial layer is provided in order to form an increased reverse bias breakdown voltage for diode devices. In one embodiment, the silicon epitaxial layer has a resisitivity of approximately 1.1 ohm-cm and a thickness of approximately 3 um in order to achieve a reverse bias breakdown voltage of about forty-five volts. Epitaxial wafers having the silicon epitaxial layer can be purchased as starting material, or formed as part of the processing of the diode using well known standard epitaxial growth techniques.

In the case of an N-type silicon substrate, the lower or backside surface of the substrate 300 forms the cathode while a portion of the top surface of the substrate 300 is formed to be the anode. In the case of a P-type silicon substrate, the diode terminals are reversed and the lower or backside surface of the substrate 300 forms the anode while a portion of the top surface of the substrate 300 is formed to be the anode.

Figure 4B:
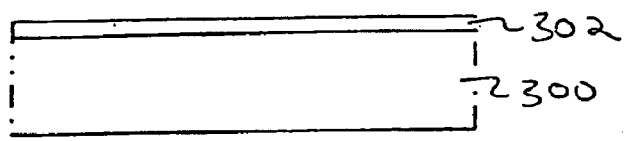

Referring now to FIG. 4B, a thin oxide 302 is grown on the surface of the substrate 300 in order to randomize sheet implants which are to follow. The thin oxide 302 is typically one hundred fifty Angstroms (150A) in thickness. Both of the sheet implants that follow require no masking by a mask but rather are ions that are implanted over the entire wafer.

The first sheet implant is to provide a good ohmic contact for the Anode region of the vertical JFED diode. The first sheet implant is an Arsenic implant at about $3 \times 10^{15}$ atoms per cm² with an energy of 25 KeV. The second sheet implant is a Phosphorous implant at about $2.0 \times 10^{13}$ atoms per cm² implanted with an energy of 85 KeV. The second sheet implant sets the "threshold" or pinch off voltage of the vertical JFED diode similar to that of a JFET.

Then a layer of polysilicon is applied on top of the thin oxide 302 across the wafer. The polysilicon layer is then patterned using a mask and areas are etched away to form cylindrical shaped construction pedestals 404 on top of the thin oxide 302.

Figure 4C:
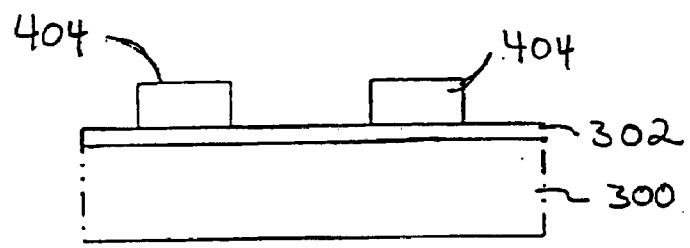

Referring now to FIG. 4C, initial construction pedestals 404 are formed on top of the thin oxide 302 by completion of a first masking step. The initial construction pedestals 404 are formed of a material other than polysilicon which is used to form the second pedestals. The cylindrical shaped construction pedestals 404 may be approximately 0.1 microns (um) high in one embodiment. The shape of the pedestals 404 can be any cylindrical shape, including but not limited to, circular, hexagonal, square, rectangular, as well as other sold shapes such as serpentine, etc. For ease of description herein, the cylindrical shape will be presumptively rectangular forming rectangular cylindrical pedestals or bars formed out of the polysilicon layer.

Figure 4D:
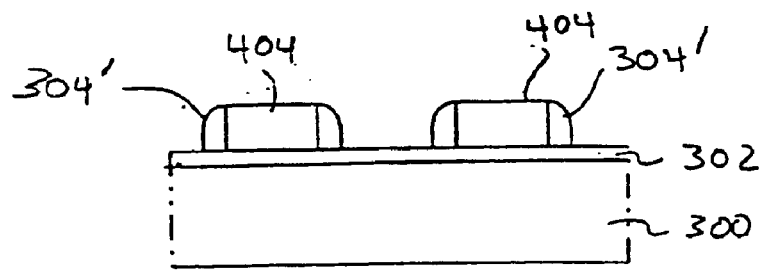

Referring now to FIG. 4D, sidewalls 304', a second pedestal of material, are formed around the initial construction pedestals 404 as described with reference to FIGS. 2A–2F.

Figure 4E:
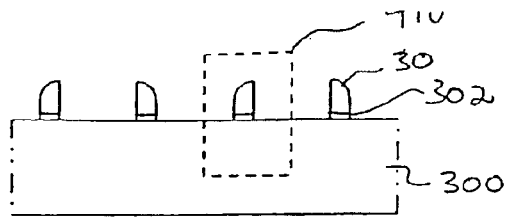
Figure 4F:
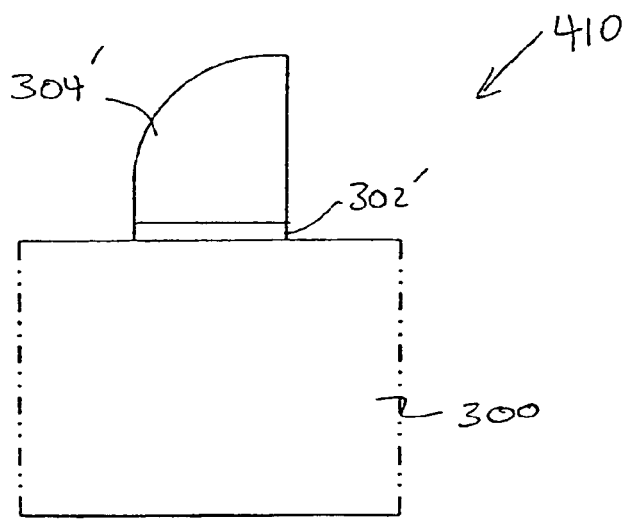

Referring now to FIG. 4E, the initial construction pedestals 404 and portions of the thin oxide 302 there-under are etched away as illustrated leaving the sidewalls 304' resting on top of oxide cylinders 302'. The region 410 is magnified into FIG. 4F as illustrated.

The pattern of sidewalls 304' can be utilized as an etch stop for other etching steps of the oxide layer 302, the substrate 300, other material layers, or a combination thereof during semiconductor processing. Alternatively, the pattern of sidewalls 304' can be utilized as a diffusion barrier to further diffusion steps of the substrate 300, other material layers, or a combination thereof during semiconductor processing.

Figure 4G:
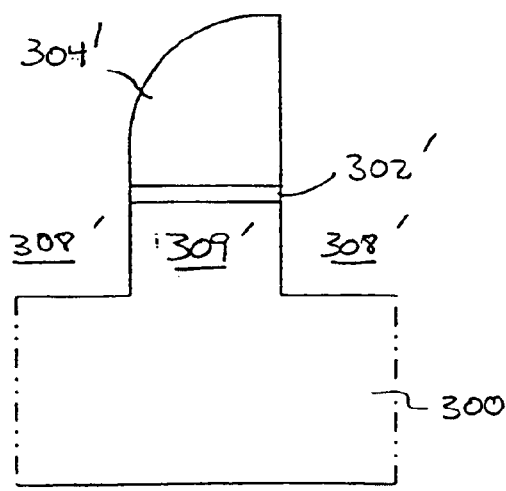

Referring now to FIG. 4G, the next step in the process is to etch away exposed portions of the substrate 300 to form the silicon trenches 308' around the sidewalls 304'and the substrate pedestals 309' under the sidewalls 304'. In this case, the pattern of sidewalls 304' was utilized as an etch stop for etching the substrate 300.

Figure 4H:
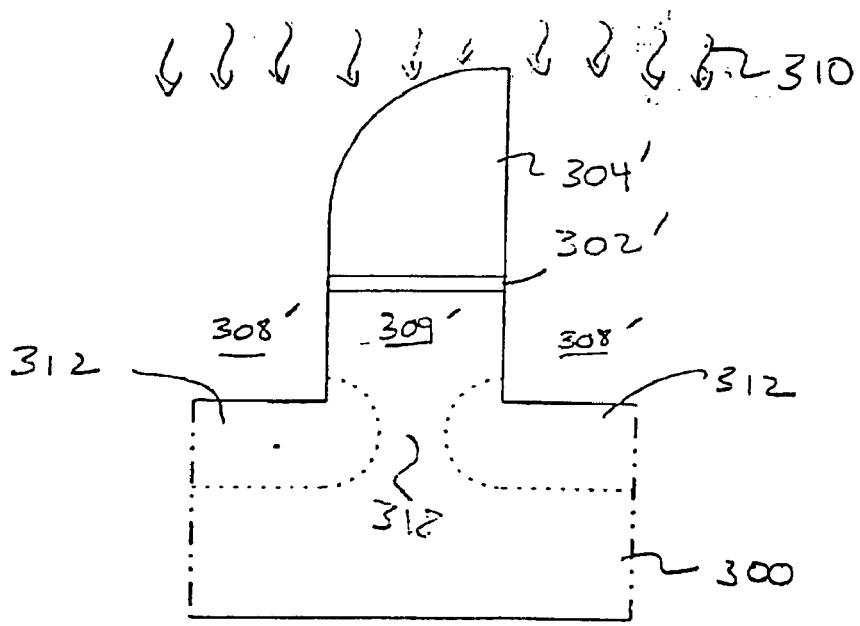
Figure 4I:
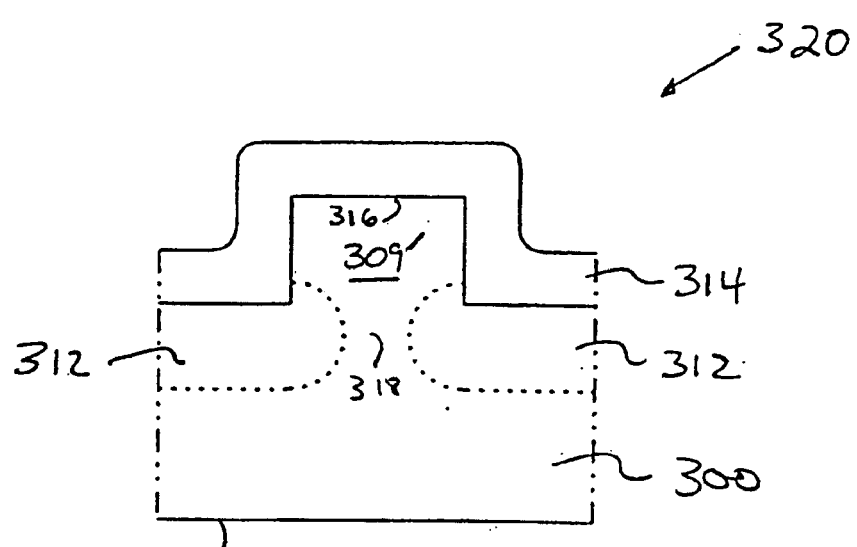

The process steps illustrated by FIGS. 4H and 4I are similar to those described previously with reference to FIGS. 3E and 3F to form the diode configured vertical JFED 320.

Referring now to FIG. 4H to illustrate the next step in the process, a boron implantation 310 is performed at the base of the substrate pedestals 309' which penetrates into the silicon substrate 300. In this case, the pattern of sidewalls 304' is utilized as a diffusion barrier to keep the oxide disks 302' and the substrate pedestals 309' from receiving dopant ions during diffusion. The boron implant diffuses laterally under the substrate pedestals 309', due to scattering and rapid thermal processing (RTP) for activation, and forms a diffusion ring around a center line of the sidewalls 304' and substrate pedestals 309' referred to as a gate 312. The diffusion ring of the gate 312 has a hollow cylindrical shape which encloses a vertical channel portion 318 of the substrate 300. The vertical channel portion of the substrate 300 is cylindrically shaped around the center line of the substrate pedestals 309' and may also be referred to as a cylindrical substrate channel.

Referring now to FIG. 4I, the final steps in the process of forming the diode configured vertical JFED 320 are illustrated where the remaining portions of the sidewalls 304' and the disk shaped portions of the thin oxide 302' are removed and a metalization layer 314 added. An oxide etch is used to remove the oxide forming the oxide disks 302' and undercut the sidewalls 304' in order to float or lift off any of their residual polysilicon material prior to metalization. A conductive layer 314, preferably a metal, is then deposited across the wafer making contact to the exposed top surfaces of the substrate 300. A metal layer may optionally be applied to the bottom surface 319 of the substrate 300 or the bottom surface 319 may otherwise make contact to a conductive surface for forming a connection of the diode through which current may flow.

While the pattern of sidewalls 304' has been described as first being utilized as an etch stop and then utilized as a diffusion barrier, the order may be reversed in other semiconductor processes such that the sidewalls 304' are first utilized as a diffusion barrier and then utilized as an etch stop.

Figure 5:
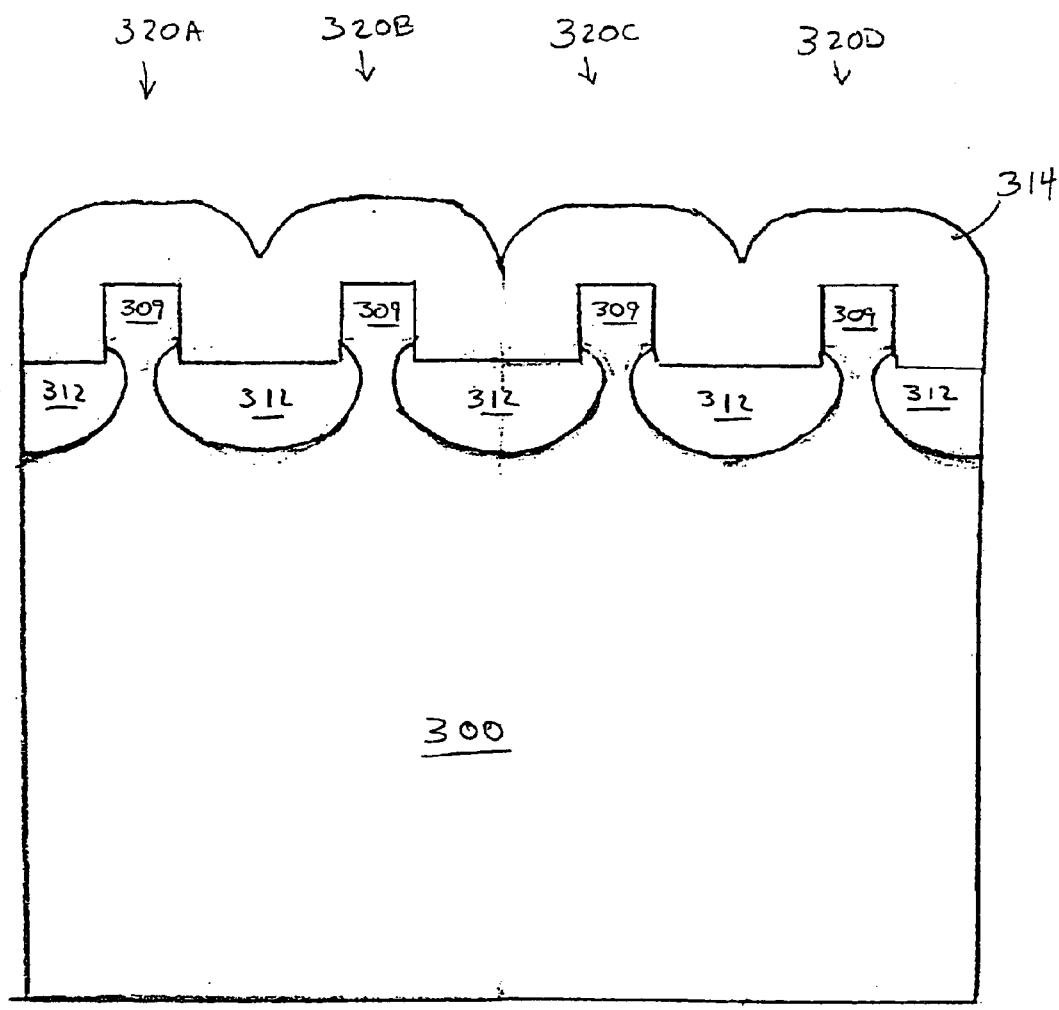
FIG. 5 is a magnified cross-sectional view illustrating four vertical JFED diode structures.

Referring now to FIG. 5, a cross-section of a series of four diode configured vertical JFEDs 320A–D are illustrated. The metal 314 can connect a plurality of diode configured vertical JFEDs together to provide a desired current carrying capacity.

Figure 6A:
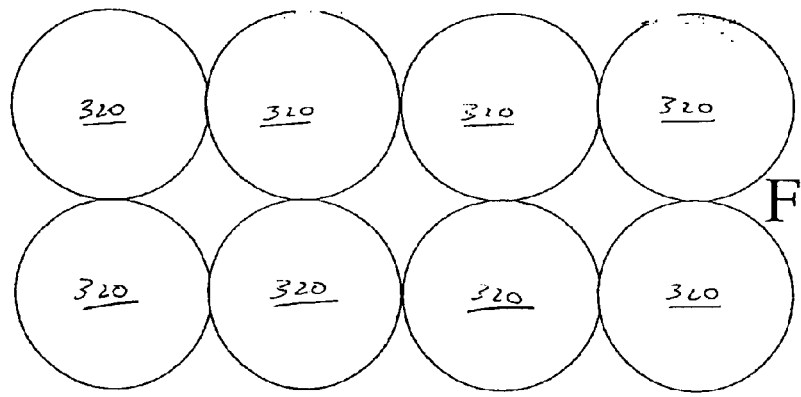
FIGS. 6A–6C are top views of alternate structures for the vertical JFED diode.
Figure 6B:
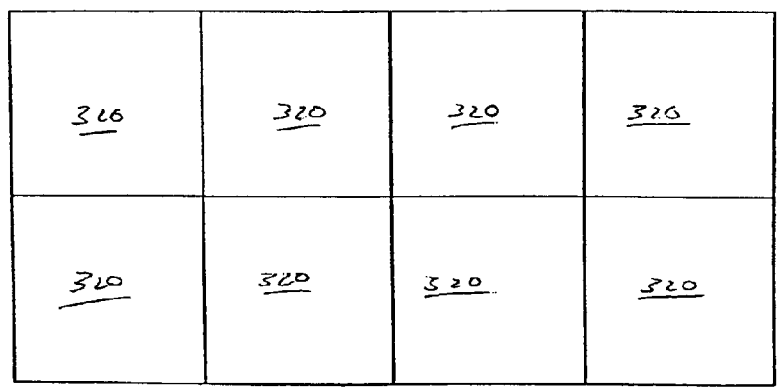
Figure 6C:
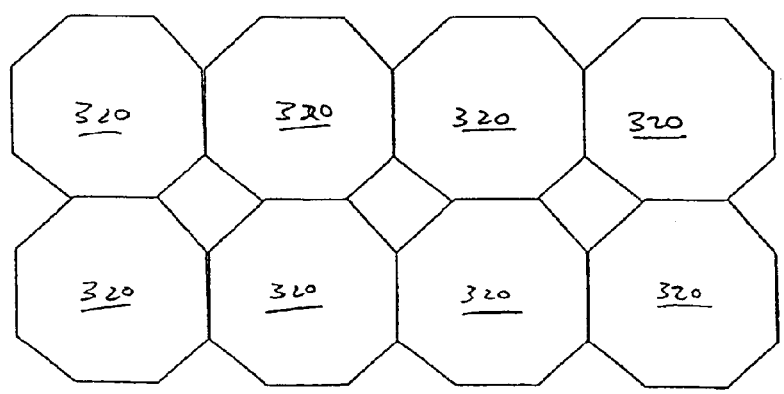

Referring now to FIGS. 6A–6C, top views of exemplary arrays of diode configured vertical JFEDs are illustrated. In FIG. 6A, the diode configured vertical JFEDs 320 are formed using circular cylindrical pedestals (sidewalls). In FIG. 6B, the diode configured vertical JFEDs 320 are formed using rectangular of square cylindrical pedestals (sidewalls). In FIG. 6C, the diode configured vertical JFEDs 320 are formed using hexagonal cylindrical pedestals (sidewalls). Other cylindrical shapes can be used for the pedestals (sidewalls) 304 and 304' in order to form different shapes of the diode configured vertical JFEDs 320.

Figure 7A:
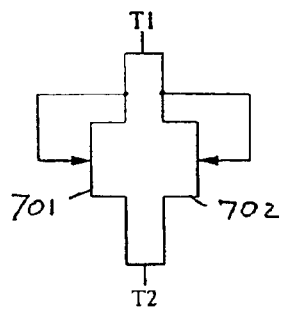
FIGS. 7A–7B illustrate schematic equivalent circuits for a two dimensional model of an N-channel vertical JFED diode.
Figure 7B:
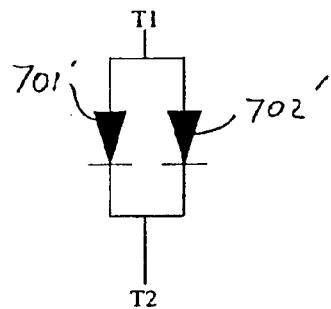
Figure 7C:
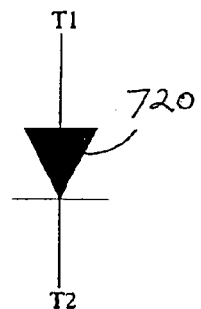
FIG. 7C illustrates the schematic equivalent circuit for a three dimensional model of the N-channel vertical JFED diode.

The process steps in FIGS. 3A–3F and 4A–4I are described as where the diffusion ring of the gate 312 is P+ type diffusion and substrate 300 is an N type of substrate. In this case, FIG. 7A illustrates the equivalent circuit of the two dimensional cross section of the diode configured vertical JFED 320. The cross-section is represented by transistors 701 and 702, each representing one vertical transistor, and are n channel JFET transistors with the first terminal, T1, being the anode and the second terminal, T2, being the cathode. FIG. 7B illustrates the diode equivalent of the two dimensional circuit of FIG. 7A where two diodes 701' and 702' are connected in parallel together. FIG. 7C illustrates the electrical equivalent, a single diode 720, of the three dimensional diode configured vertical JFED 320.

Figure 8A:
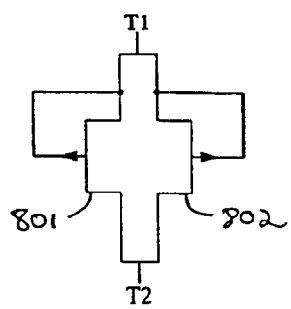
FIGS. 8A–8B illustrate schematic equivalent circuits for a two dimensional model of an P-channel vertical JFED diode.
Figure 8B:
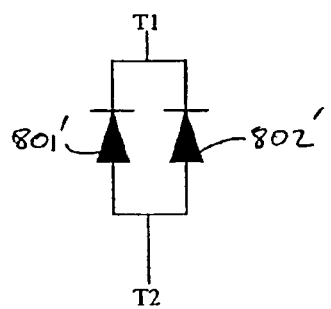
Figure 8C:
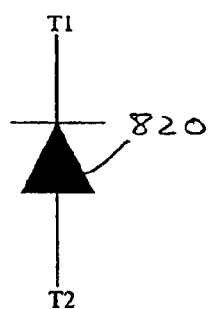
FIG. 8C illustrates the schematic equivalent circuit for a three dimensional model of the P-channel vertical JFED diode.

While the process steps in FIGS. 3A–3F and 4A–4I are described as where the diffusion ring of the gate 312 is P+ type diffusion and substrate 300 is an N type of substrate, they may be altered by using different starting materials and different implant or dopant materials. In this case the diffusion types are reversed from n to p and from p to n in the process steps previously described. FIG. 8A illustrates the equivalent circuit of the two dimensional cross section of the diode configured vertical JFED 320 illustrated in FIG. 3F with reversed type of silicon diffusion and materials. In this case, the diffusion ring of the gate 312 is N+ type diffusion and substrate 300 is a P type of substrate. In FIG. 8A, the transistors 801 and 802, each representing one vertical transistor, are p channel JFET transistors and the first terminal, T1, is the cathode and the second terminal, T2, is the anode. FIG. 8B illustrates the diode equivalent of the two dimensional circuit of FIG. 8A where two diodes 801' and 802' are connected in parallel together. FIG. 8C illustrates the electrical equivalent, a single diode 820, of the three dimensional diode configured vertical JFED with altered material types.

Figure 9:
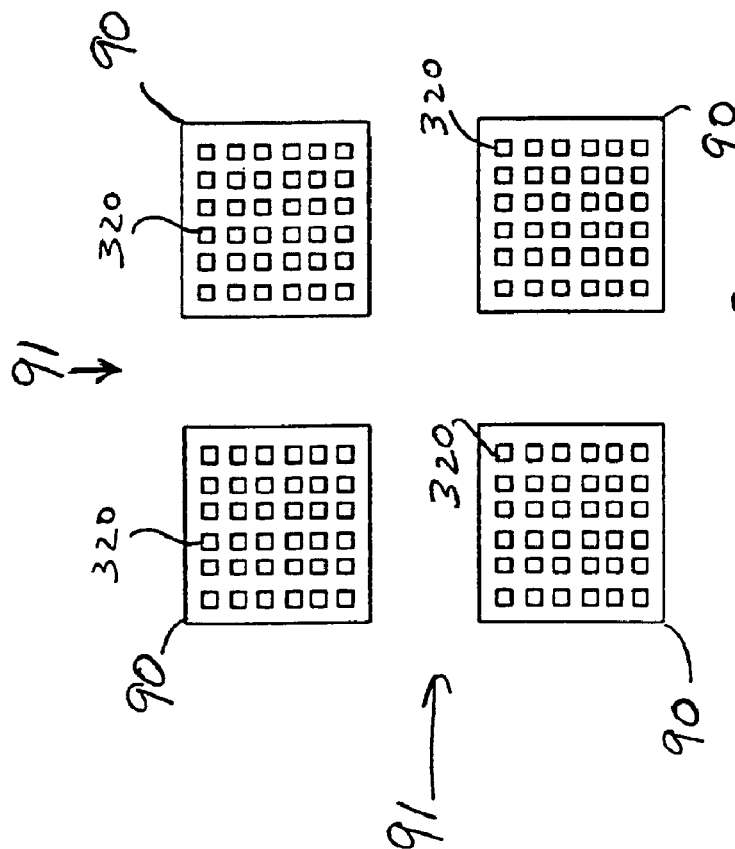
FIG. 9 illustrates active diode areas on a wafer employing a plurality of vertical JFED diodes.

Referring now to FIG. 9, a plurality of diode active areas 90 are separated by scribe channels 91 between the diode active areas 90 on the wafer. In each diode active area 90 are a plurality of diode configured vertical JFEDs 320. Edge termination of the diode active areas in the scribe channels 91 can be provided through several semiconductor device terminations including a tapered termination or a mesa termination. Additionally, single or multiple normal ring terminations which are well known can be used; or, voltage permitting, a simple guard ring integral with the device active diffusions can be used.

Figure 10:
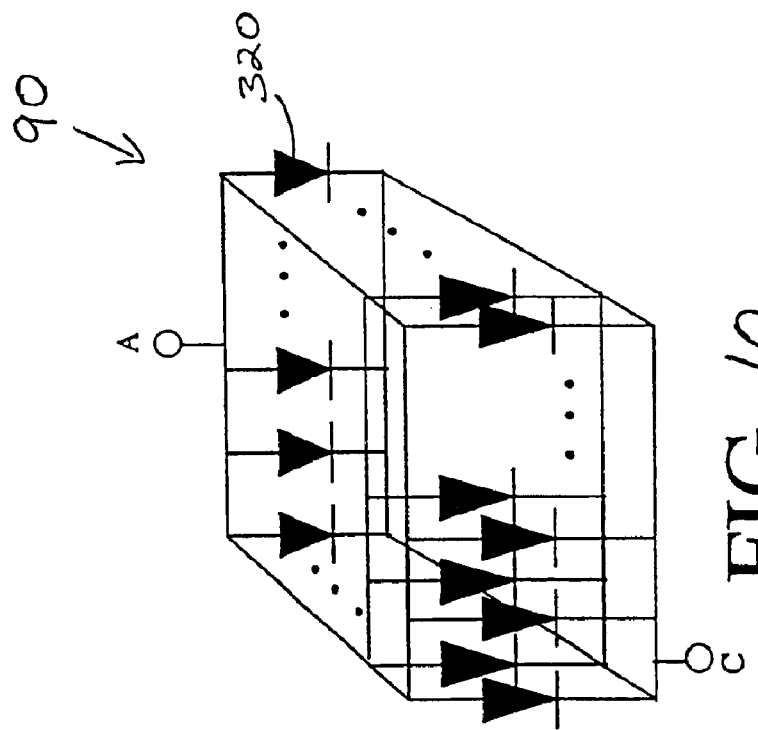
FIG. 10 is a schematic diagram of the electrical equivalent of one active diode area.

Referring now to FIG. 10, the schematic equivalent of the diode active area 90 having multiple diodes 720, each representing a diode configured vertical JFED 320, connected in parallel together. Adding the current capability of each of the diode configured vertical JFED devices 320 connected in parallel together results in a large current carrying capability. It is understood that there are several hundred diode active areas 90 on a wafer, with only four being shown in FIG. 9. Each individual diode active area 90 can contain thousands of individual diode configured vertical JFEDs 320.

With respect to the current capability of the diode, the forward current is a function of the number of diode configured vertical JFEDs 320 which are coupled in parallel together.

With respect to the threshold voltage, by appropriately selecting the dopants, their concentrations, and other materials and dimensions for fabrication of the diode configured vertical JFED, the channel regions may be made to just conduct at substantially zero forward bias across the anode and cathode. Thus, in true rectifying applications such as in power supplies and the like, the invention results in reduced power consumption and heating in the rectifying devices, and greater overall efficiency of the resulting circuits.

With respect to the reverse bias breakdown voltage of the diode configured vertical JFED 320, a reverse bias voltage appears between the gate 312 and the substrate 300 causing the channel 318 to be pinched off and a depletion region to form in the substrate 300. The electric field lines of the reverse bias voltage are substantially planar around the diode configured vertical JFED due to the longitudinal shape of the diffusion for the gate 312 and the very small dimensions of the pedestals. This planar field effect increases the reverse breakdown voltage capability. To increase the reverse bias breakdown voltage further, it is desirable to keep the electric field lines straight and parallel with little crowding at pn junctions and having a minimal amount of curvature near electric field termination points such as at device termination near the scribe lines 91.

Referring now to FIGS. 11A–13A and FIGS. 11B–13B, top views and cross-sectional side views of another embodiment for forming sidewalls in the processing of a semiconductor device are illustrated.

Referring now to FIGS. 11A and 11B, a substrate 1301 is covered with a uniform layer 1302 of material1 and a uniform layer 1303 of material2. A thick layer of material2 is then deposited on top of the uniform layer 1303. The thick layer of material2 is then patterned using a mask to form pedestals 1200'. The mask has repetitive patterns of oval geometric shapes to form the oval construction pedestals 1200' illustrated in FIGS. 11A and 11B.

Referring now to FIGS. 12A and 12B, sidewalls 1210' of material1 are formed around the construction pedestals 1200'. Between the repetitive pattern of sidewalls 1210' is a space 1209'. The top view as illustrated by FIG. 12A, shows the oval cylinders of the sidewalls 1210' concentric with the construction pedestals 1200'.

Referring now to FIGS. 13A and 13B, the pedestals 1200' of material2 and exposed portions of the uniform layer 1303 are removed by an etching step leaving a repetitive pattern of hollow cylindrical sidewalls 1210' having a cross-section of the width of the sidewall. Spaces 1214 are formed therein, while spaces 1209' remain between adjacent sidewalls 1210'. A hollow cylindrical portion 1303' of the uniform layer 1303 remains intact under the hollow cylindrical sidewalls 1210'. The uniform layer 1302 may provide an etch stop to keep unexposed portions of the substrate from being etched. However, if the pattern of sidewalls 1210' has the desired pitch, further division of the initial pitch is not needed and the process can jump to processing the substrate 1301 and the uniform layer 1302.

Figure 16:
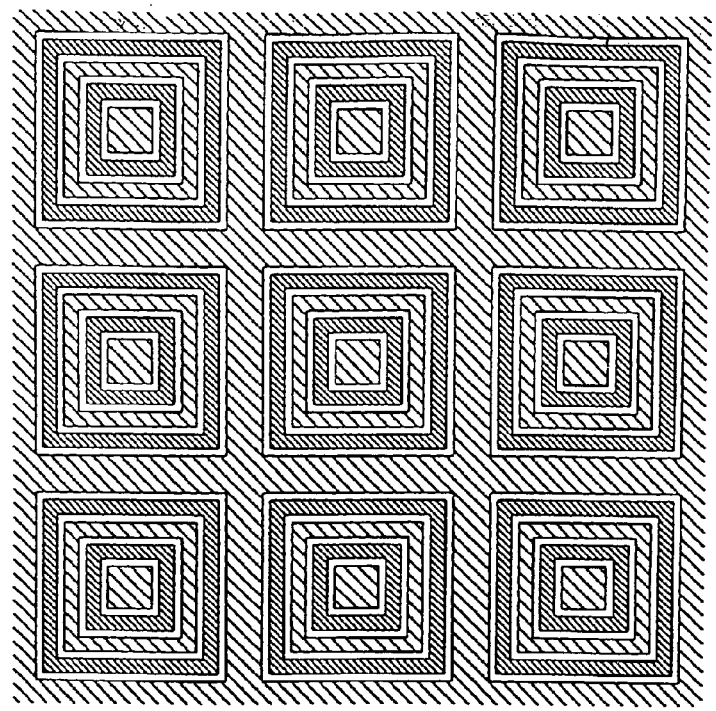
FIGS. 14–16 are top views of alternate embodiments of geometric shapes having the fine geometric dimensions of a repetitive pattern formed using sidewalls.
Figure 14:
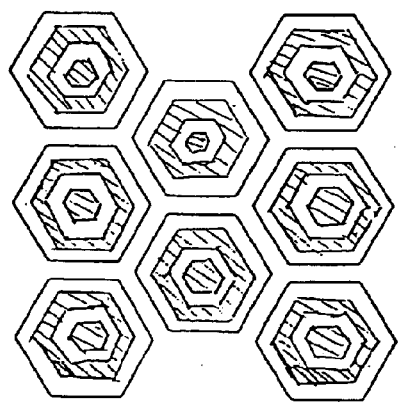
Figure 15:
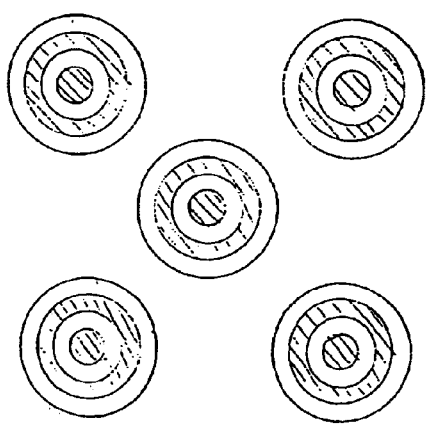

FIGS. 14–16 are top views of alternate embodiments of geometric shapes having fine geometric dimensions of a repetitive pattern for a semiconductor device. FIG. 14 illustrates a hexagonal repetitive pattern used to form fine geometries. FIG. 15 illustrates a circular repetitive pattern used to form fine geometries. FIG. 16 illustrates a square or rectangular repetitive pattern to form fine geometries. Each of the resultant patterns have concentric cylindrically shaped sidewalls having a cross-sectional thickness of the width and spaced apart by the spacing in order to form the final pitch.

In certain instances in the foregoing description, certain alternate materials and methods were set forth. It is to be noted however, that the identification of specific alternative materials and processes is not to infer that still other materials and processes for those or other steps in the process of fabrication or in the resulting diode devices are excluded from use in the invention. To the contrary, steps and materials other than those set out herein will be known to those skilled in the art. Thus while the invention has been disclosed and described with respect to certain preferred embodiments, it will be understood to those skilled in the art that the invention may be varied without departing from the spirit and scope of thereof.

What is claimed is:

1. A method of processing for a semiconductor device, the method comprising:

providing a wafer including a substrate;

forming a plurality of sidewalls around a plurality of cylindrical pedestals above a surface of the substrate;

removing the plurality of cylindrical pedestals; and vertically etching horizontal surfaces of a first material located around the plurality of sidewalls, wherein the plurality of sidewalls provide an etch stop and protect the first material under the plurality of sidewalls from being etched during the vertical etching of the first material.

2. The method of claim 1, further comprising:
removing the plurality of sidewalls.

3. The method of claim 1, further comprising:
diffusing a dopant into the first material located around the plurality of sidewalls.

4. The method of claim 1, further comprising:
diffusing a dopant into a second material around the plurality of sidewalls.

5. The method of claim 1, further comprising:
diffusing a dopant into the first material and a second material around the plurality of sidewalls.

6. The method of claim 1, further comprising:
diffusing a dopant into the first material or a second material around the plurality of sidewalls.

7. The method of claim 6, wherein,
the plurality of sidewalls provide an etch stop and a diffusion barrier.

8. The method of claim 7, wherein,
the plurality of sidewalls protect the first material under the plurality of sidewalls from receiving a dopant during the diffusing of the dopant into the first material or the second material.

9. The method of claim 7, wherein,
the plurality of sidewalls protect the second material under the plurality of sidewalls from receiving a dopant during the diffusing of the dopant into the first material and the second material.

10. The method of claim 7, wherein,
the plurality of sidewalls protect the first material and the second material under the plurality of sidewalls from receiving a dopant during the diffusing of the dopant into the first material or the second material.

11. A method of processing for a semiconductor device, the method comprising:

providing a wafer including a substrate;

forming a plurality of sidewalls around a plurality of cylindrical pedestals above a surface of the substrate;

removing the plurality of cylindrical pedestals;

vertically etching horizontal surfaces of a first material located around the plurality of sidewalls, wherein the plurality of sidewalls provide an etch stop and protect the first material under the plurality of sidewalls from being etched during the vertical etching of the first material; and diffusing a dopant into the first material located around the plurality of sidewalls.

12. The method of claim 11, wherein,
the plurality of sidewalls further provide a diffusion barrier.

13. The method of claim 12, wherein,
the plurality of sidewalls protect the first material under the plurality of sidewalls from receiving a dopant during the diffusing of the dopant into the first material.

14. The method of claim 11, further comprising:
removing at least one of the plurality of sidewalls.

15. The method of claim 11, further comprising:
vertically etching horizontal surfaces of a second material located around the plurality of sidewalls.

16. The method of claim 11, further comprising:
vertically etching horizontal surfaces of the substrate located around the plurality of sidewalls.

17. The method of claim 15 wherein,
the plurality of sidewalls further provide a diffusion barrier.

18. The method of claim 17, wherein,
the plurality of sidewalls protect the first material under the plurality of sidewalls from being etched during the etching of the first material.

19. The method of claim 17, wherein,
the plurality of sidewalls protect the second material under the plurality of sidewalls from being etched during the etching of the second material.

20. The method of claim 15 wherein,
the plurality of sidewalls protect the first material and the second material under the plurality of sidewalls from being etched during the vertical etching of the first material and the second material.

21. A method of processing for a semiconductor device, the method comprising:

providing a wafer including a substrate of the semiconductor device;

forming a plurality of sidewalls around a plurality of cylindrical pedestals above a surface of the substrate;

removing the plurality of cylindrical pedestals;

vertically etching horizontal surfaces of a first material located around the plurality of sidewalls, wherein the plurality of sidewalls provide an etch stop and protect the first material under the plurality of sidewalls from being etched during the vertical etching of the first material; and diffusing a dopant around the plurality of sidewalls.

22. The method of claim 21, wherein, the plurality of sidewalls are formed by forming the plurality of cylindrical pedestals above the surface of the substrate, depositing a sidewall material layer over the cylindrical pedestals and the substrate, vertically etching the horizontal surfaces of the sidewall material, and the plurality of cylindrical pedestals are removed by etching away the plurality of cylindrical pedestals.

23. The method of claim 21, wherein, the vertical etching of horizontal surfaces of the first material located around the plurality of sidewalls is performed using a substantially anisotropic etchant.

24. The method of claim 21, wherein, the plurality of sidewalls provide an etch stop and a diffusion barrier.

25. The method of claim 24, wherein, the plurality of sidewalls protect the first material under the plurality of sidewalls from being etched during the etching of the first material around the plurality of sidewalls and the plurality of sidewalls protect the first material under the plurality of sidewalls from receiving the dopant during the diffusing of the dopant around the plurality of sidewalls.

26. A method of processing for a semiconductor device, the method comprising:

providing a wafer including a substrate of the semiconductor device, the semiconductor device being a transistor or a diode;

forming a plurality of sidewalls around a plurality of cylindrical pedestals above a surface of the substrate;

removing the plurality of cylindrical pedestals;

vertically etching horizontal surfaces of a first material located around the plurality of sidewalls, wherein the plurality of sidewalls provide an etch stop and protect the first material under the plurality of sidewalls from being etched during the vertical etching of the first material; and diffusing a dopant around the plurality of sidewalls.

27. The method of claim 26, wherein, the plurality of sidewalls provide a diffusion barrier.

28. The method of claim 26, wherein, the plurality of sidewalls are formed by forming the plurality of cylindrical pedestals above the surface of the substrate, depositing a sidewall material layer over the cylindrical pedestals and the substrate, vertically etching the horizontal surfaces of the sidewall material, and the plurality of cylindrical pedestals are removed by etching away the plurality of cylindrical pedestals.

29. The method of claim 26, wherein, the plurality of sidewalls provide an etch stop and a diffusion barrier.

30. The method of claim 26 wherein, the vertical etching of horizontal surfaces of the first material located around the plurality of sidewalls is performed using a substantially anisotropic etchant.

31. The method of claim 29, wherein, the plurality of sidewalls protect the first material under the plurality of sidewalls from being etched during the vertical etching of horizontal surfaces of the first material around the plurality of sidewalls and the plurality of sidewalls protect the first material under the plurality of sidewalls from receiving the dopant during the diffusing of the dopant around the plurality of sidewalls.

32. The method of claim 26, wherein, the first material located around the plurality of sidewalls which is vertically etched is the substrate.

33. The method of claim 26, wherein, the first material located around the plurality of sidewalls which is vertically etched is a layer exposed over a surface of the substrate and protected under the plurality of sidewalls.

34. A method of processing for a semiconductor device, the method comprising:

providing a wafer including a substrate of the semiconductor device, the semiconductor device being a transistor or a diode;

forming a plurality of sidewalls around a plurality of cylindrical pedestals above a surface of the substrate;

removing the plurality of cylindrical pedestals; and vertically etching horizontal surfaces of a first material located around the plurality of sidewalls, wherein the plurality of sidewalls provide an etch stop and protect the first material under the plurality of sidewalls from being etched during the vertical etching of the first material.

35. The method of claim 34, wherein, the first material located around the plurality of sidewalls which is horizontally etched is the substrate.

36. The method of claim 34, wherein, the first material located around the plurality of sidewalls which is horizontally etched is an epitaxial layer of the substrate.

37. The method of claim 34, wherein, the first material located around the plurality of sidewalls which is horizontally etched is a layer exposed over a surface of the substrate and protected under the plurality of sidewalls.

38. The method of claim 34, wherein, the vertical etching of horizontal surfaces of the first material located around the plurality of sidewalls is performed using a substantially anisotropic etchant.

39. The method of claim 34, wherein, the plurality of sidewalls are formed by forming the plurality of cylindrical pedestals above the surface of the substrate, depositing a sidewall material layer over the cylindrical pedestals and the substrate, vertically etching the horizontal surfaces of the sidewall material, and the plurality of cylindrical pedestals are removed by etching away the plurality of cylindrical pedestals.

40. The method of claim 34, further comprising:

implanting a dopant around the plurality of sidewalls.

41. The method of claim 40, wherein, the plurality of sidewalls provide an etch stop and a barrier.

42. The method of claim 41, wherein, the plurality of sidewalls protect the first material under the plurality of sidewalls from being etched during the vertical etching of the first material located around the plurality of sidewalls and the plurality of sidewalls protect the first material under the plurality of sidewalls from receiving the dopant during the diffusing of the dopant around the plurality of sidewalls.

43. The method of claim 40, wherein, the dopant is implanted into the substrate around the plurality of sidewalls.

44. The method of claim 40, wherein, the dopant is implanted into the first material around the plurality of sidewalls.

45. The method of claim 4, wherein the plurality of sidewalls provide an etch stop and a diffusion barrier.

46. The method of claim 45, wherein the plurality of sidewalls protect the first material under the plurality of sidewalls from receiving a dopant during the diffusing of the dopant into the first material or the second material.

47. The method of claim 45, wherein the plurality of sidewalls protect the second material under the plurality of sidewalls from receiving a dopant during the diffusing of the dopant into the first material and the second material.

48. The method of claim 45, wherein, the plurality of sidewalls protect the first material and the second material under the plurality of sidewalls from receiving a dopant during the diffusing of the dopant into the first material or the second material.

49. The method of claim 5, wherein the plurality of sidewalls provide an etch stop and a diffusion barrier.

50. The method of claim 49, wherein the plurality of sidewalls protect the first material under the plurality of sidewalls from receiving a dopant during the diffusing of the dopant into the first material or the second material.

51. The method of claim 49, wherein the plurality of sidewalls protect the second material under the plurality of sidewalls from receiving a dopant during the diffusing of the dopant into the first material and the second material.

52. The method of claim 49, wherein, the plurality of sidewalls protect the first material and the second material under the plurality of sidewalls from receiving a dopant during the diffusing of the dopant into the first material or the second material.

\* \* \* \* \*